(12) United States Patent
Liao et al.

(10) Patent No.: US 12,300,534 B2
(45) Date of Patent: May 13, 2025

(54) METHOD OF FORMING PROTECTIVE LAYER UTILIZED IN SILICON REMOVE PROCESS

(71) Applicant: UNITED MICROELECTRONICS CORP., Hsin-Chu (TW)

(72) Inventors: Chia-Liang Liao, Yunlin County (TW); Chee Hau Ng, Singapore (SG); Ching-Yang Wen, Singapore (SG); Purakh Raj Verma, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 399 days.

(21) Appl. No.: 17/880,685

(22) Filed: Aug. 4, 2022

(65) Prior Publication Data

US 2024/0047266 A1    Feb. 8, 2024

(51) Int. Cl.
*H01L 21/762* (2006.01)
*H01L 21/304* (2006.01)
*H01L 21/768* (2006.01)

(52) U.S. Cl.
CPC ...... *H01L 21/76251* (2013.01); *H01L 21/304* (2013.01); *H01L 21/76865* (2013.01)

(58) Field of Classification Search
CPC ............ H01L 21/76251; H01L 21/304; H01L 21/76865; H01L 25/0657; H01L 2224/08145; H01L 2225/06541; H01L 25/50
See application file for complete search history.

(56) References Cited

U.S. PATENT DOCUMENTS

| 8,314,007 B2 | 11/2012 | Vaufredaz |
| 2021/0305205 A1 | 9/2021 | Hsieh |
| 2022/0271023 A1* | 8/2022 | Wu ..................... H01L 21/3043 |

* cited by examiner

*Primary Examiner* — John P. Dulka
(74) *Attorney, Agent, or Firm* — Winston Hsu

(57) ABSTRACT

A method of forming a protective layer utilized in a silicon remove process includes bonding a first wafer to a second wafer, wherein the first wafer comprises a first silicon substrate with a first device structure disposed thereon and the second wafer comprises a second silicon substrate with a second device structure disposed thereon. After that, a first trim process is performed to thin laterally an edge of the first wafer and an edge of the second device structure. After the first trim process, a protective layer is formed to cover a back side of the second silicon substrate. After forming the protective layer, a silicon remove process is performed to remove only the first silicon substrate.

10 Claims, 5 Drawing Sheets

First grind process
⇩
First trim process
Protective layer →   ⇩
     or        Forming a silicon oxide layer
Protective layer →   ⇩
     or        Second grind process
Protective layer →   ⇩
              Silicon remove process

METHOD OF FORMING PROTECTIVE LAYER UTILIZED IN SILICON REMOVE PROCESS

BACKGROUND OF THE INVENTION

1. Field of the Invention

The present invention relates to a method of forming a protective layer, and more particularly to a method of forming a protective layer utilized in removing a silicon substrate.

2. Description of the Prior Art

Wafer bonding is the act of attaching a device wafer to another device wafer or a handling wafer so that it can be processed.

Wafer bonding provides for the packaging of semiconductor devices at a wafer level and is employed in a variety of technologies including 3D-integrated circuits (IC), chip scale package (CSP) devices, and micro-electro-mechanical systems (MEMS). The advantages of using Wafer bonding include enhancing electrical properties, providing for increased density, reducing device sizes, reducing costs, and allowing for additional testing at wafer level.

Semiconductor wafer manufacturing utilizes very sophisticated wafer processing procedures and complicated manufacturing systems. In efforts to reduce the size of the semiconductor package, manufacturers have reduced component sizes including the thickness of the wafer. However, in a conventional process, when removing the thickness of a device wafer, a surface of another device wafer is damaged.

SUMMARY OF THE INVENTION

In view of this, the present invention provides a protective layer used in a removing process to prevent the surface damage.

A method of forming a protective layer utilized in a silicon remove process includes bonding a first wafer to a second wafer, wherein the first wafer comprises a first silicon substrate with a first device structure disposed thereon and the second wafer comprises a second silicon substrate with a second device structure disposed thereon. After that, a first trim process is performed to thin laterally an edge of the first wafer and an edge of the second device structure. After the first trim process, a protective layer is formed to cover a back side of the second silicon substrate. After forming the protective layer, a silicon remove process is performed to remove only the first silicon substrate.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 7 depict a method of forming a protective layer utilized in a silicon remove process according to a preferred embodiment of the present invention, wherein:

FIG. 1 depicts a step of bonding a first wafer to a second wafer;

FIG. 2 is a fabricating stage following FIG. 1;

FIG. 3 is a fabricating stage following FIG. 2;

FIG. 4 is a fabricating stage following FIG. 3;

FIG. 5 is a fabricating stage following FIG. 4;

FIG. 6 is a fabricating stage following FIG. 5; and

FIG. 7 is a fabricating stage following FIG. 6.

FIG. 8 to FIG. 9 depict a method of forming a deep via on a bonded wafer structure according to a preferred embodiment of the present invention, wherein:

FIG. 8 depicts a step of a CMP process; and

FIG. 9 is a fabricating stage following FIG. 8.

FIG. 10 depicts a flow chart of a method of forming a protective layer utilized in a silicon remove process according to a preferred embodiment of the present invention.

DETAILED DESCRIPTION

FIG. 1 to FIG. 7 depict a method of forming a protective layer utilized in a silicon remove process according to a preferred embodiment of the present invention.

Figure 1:
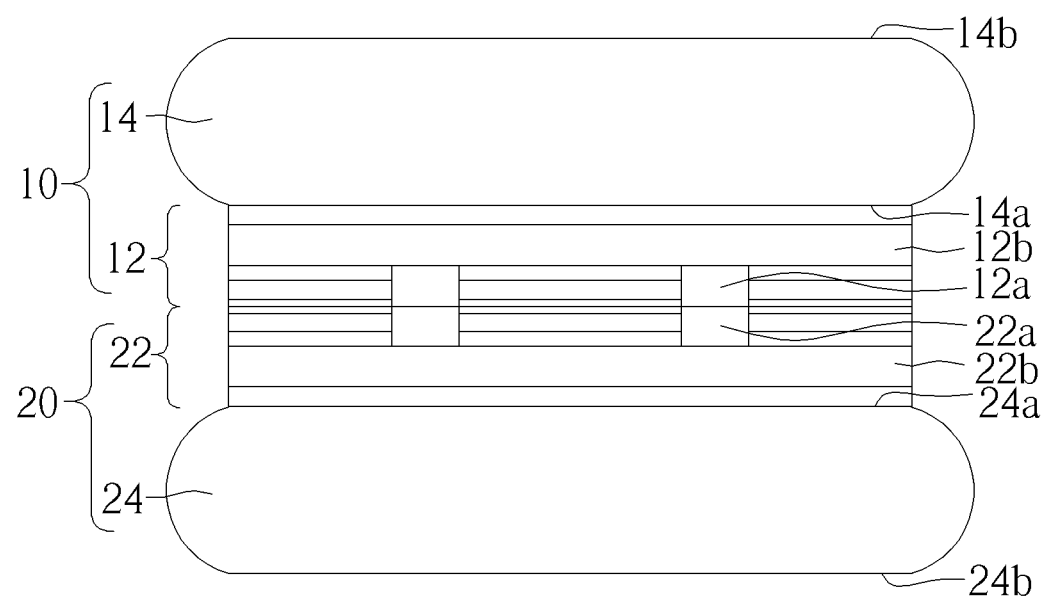

As shown in FIG. 1, a first wafer 10 and a second wafer 20 are provided. The first wafer 10 includes a first silicon substrate 14 and a first device structure 12. The first silicon substrate 14 has a first front side 14a and a first back side 14b. The first front side 14a is opposed to the first back side 14b. The first device structure 12 is disposed on and contacts the first front side 14a of first silicon substrate 14. The first device structure 12 includes interconnect elements 12a, dielectric layers 12b and transistors (not shown).

Similarly, the second wafer 20 includes a second silicon substrate 24 and a second device structure 22. The second silicon substrate 24 has a second front side 24a and a second back side 24b. The second front side 24a is opposed to the second back side 24b. The second device structure 22 is disposed on and contacts the second front side 24a of the second silicon substrate 24. The second device structure 22 includes interconnect elements 22a, dielectric layers 22b and transistors (not shown). In another case, the first wafer 10 may be a handling wafer made of silicon. At this point, the first back side 14b of the first silicon substrate 14 and the second back side 24b of the second silicon substrate 24 are exposed. More specifically speaking, the first back side 14b of the first silicon substrate 14 and the second back side 24b of the second silicon substrate 24 are not contacted by silicon nitride or silicon oxide.

Later, the first wafer 10 is bonded to the second wafer 20. The first wafer 10 and the second wafer 20 may be bonded to each other by bonding a top surface of the first device structure 12 to a top surface of the second device structure 22. For example, the interconnect element 12a of the first device structure 12 may be bonded to the interconnect element 22a of the second device structure 22. Metal-to-metal bonding (such as copper-to-copper bonding) may be used. In one embodiment, oxide-to-oxide bonding between the dielectric layer 12b of the first device structure 12 and the dielectric layer 22b of the second device structure 22 may also be used.

Figure 2:
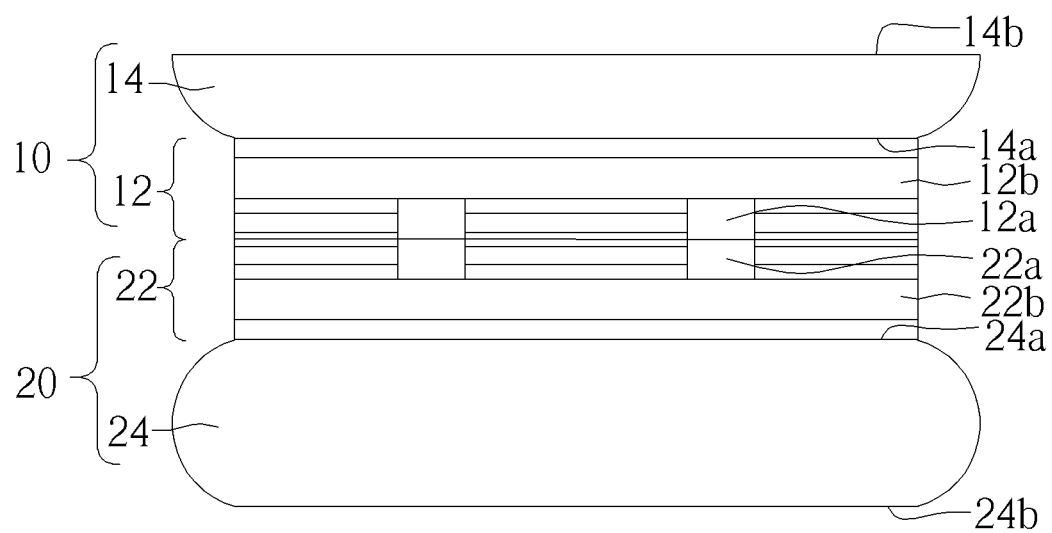
Figure 3:
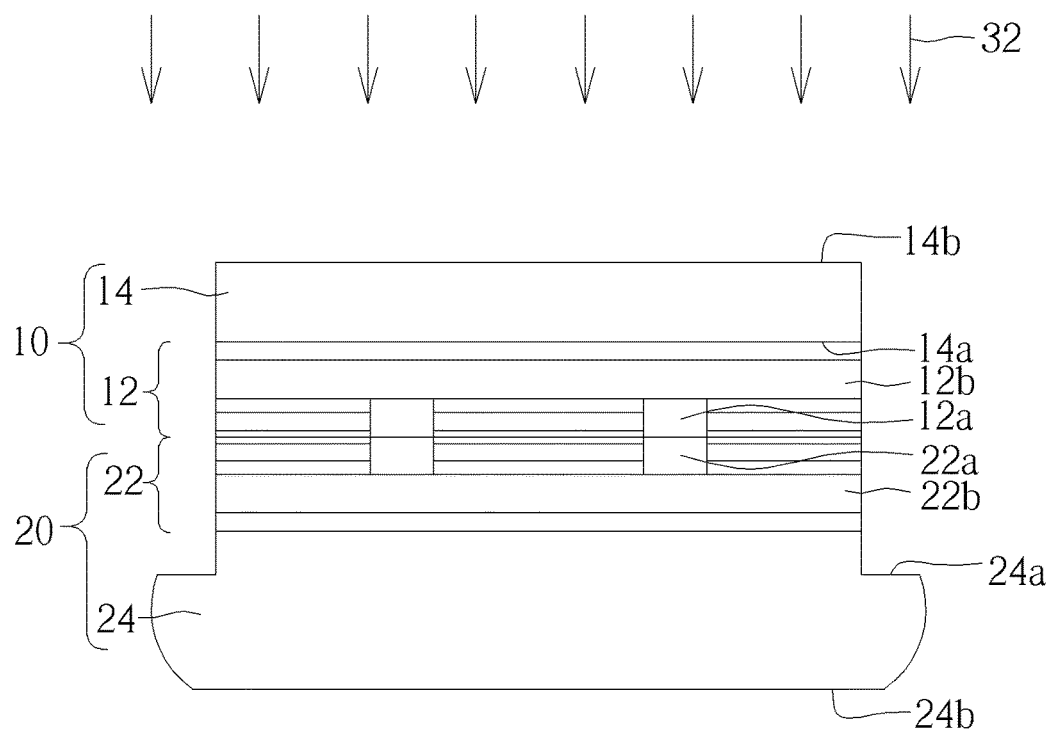

As shown in FIG. 2, a first grind process 30 is performed to thin vertically a first back side 14b of the first silicon substrate 14. The first grind process 30 may be performed by using a grinding wheel. As shown in FIG. 3, a first trim process 32 is performed to thin laterally an edge of the first wafer 10 and an edge of the second device structure 22. For instance, the first trim process 32 may be performed by using an edge grinding process which includes using a grinder or any other tool that is capable of mechanically wearing away the edge of the first wafer 10 and the edge of the second device structure 22 along their circumferences.

Figure 4:
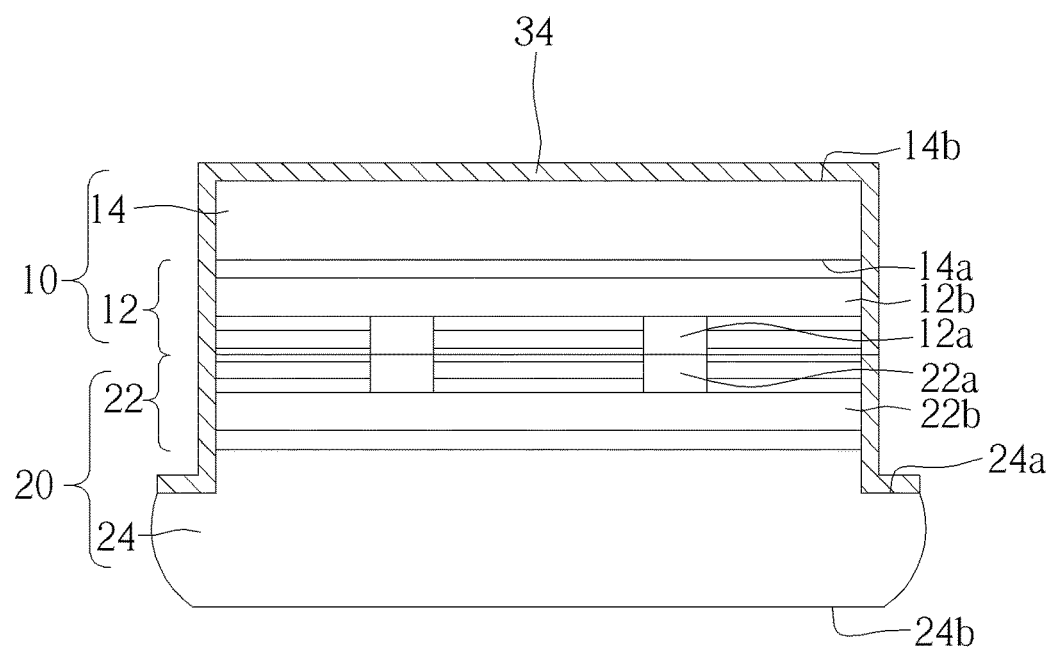

As shown in FIG. 4, a silicon oxide layer 34 is formed to cover the first wafer 10, the second front side 24a of the second silicon substrate 24 and the edge of the second device structure 22. The silicon oxide layer 34 conformally covers the contour of the first silicon substrate 14, the first device structure 12, the second device structure 22 and the second front side 24a of the second silicon substrate 24. The silicon oxide layer 34 may be tetraethoxysilane (TEOS) formed by a deposition process.

Figure 5:
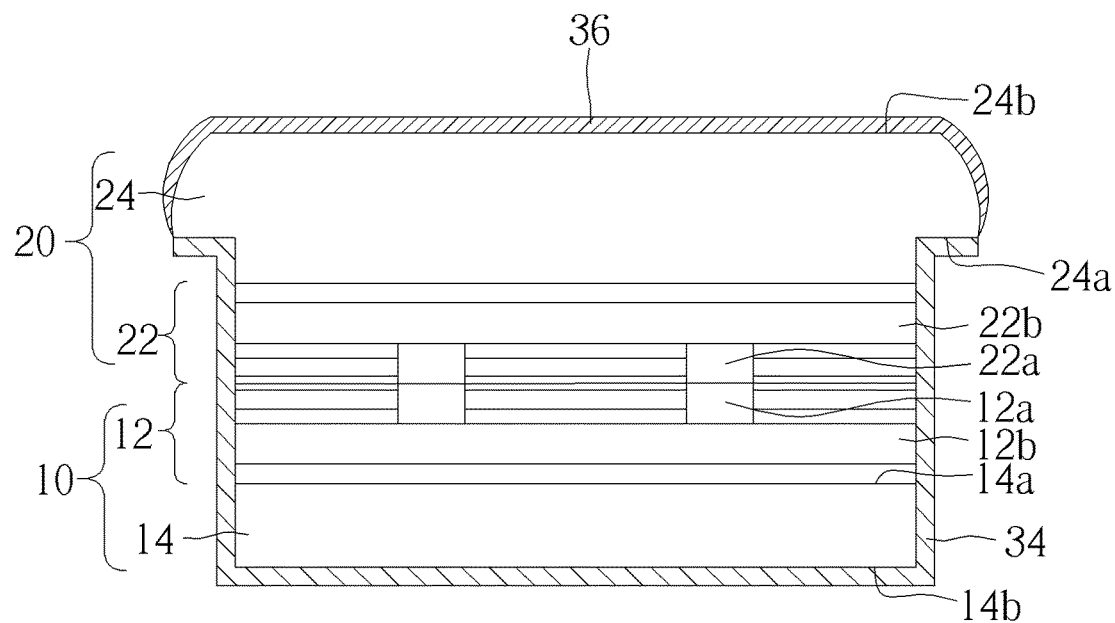

As shown in FIG. 5, the first wafer 10 and the second wafer 20 are flipped over. Next, a protective layer 36 is formed conformally to cover the second back side 24b of the second silicon substrate 24. The protective layer 36 is preferably silicon oxide or silicon nitride. If the protective layer 36 is silicon oxide, a thickness of the protective layer 36 is advantageously between 300 and 400 angstroms. If the protective layer 36 is silicon nitride, a thickness of the protective layer 36 is preferably between 400 and 700 angstroms. The protective layer 36 may be formed by a deposition process, an oxidation process or a nitriding treatment.

Figure 6:
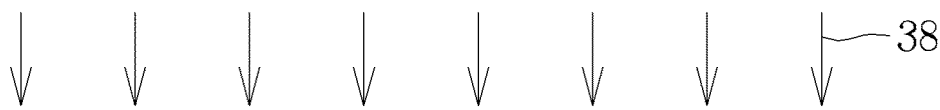
Figure 6:
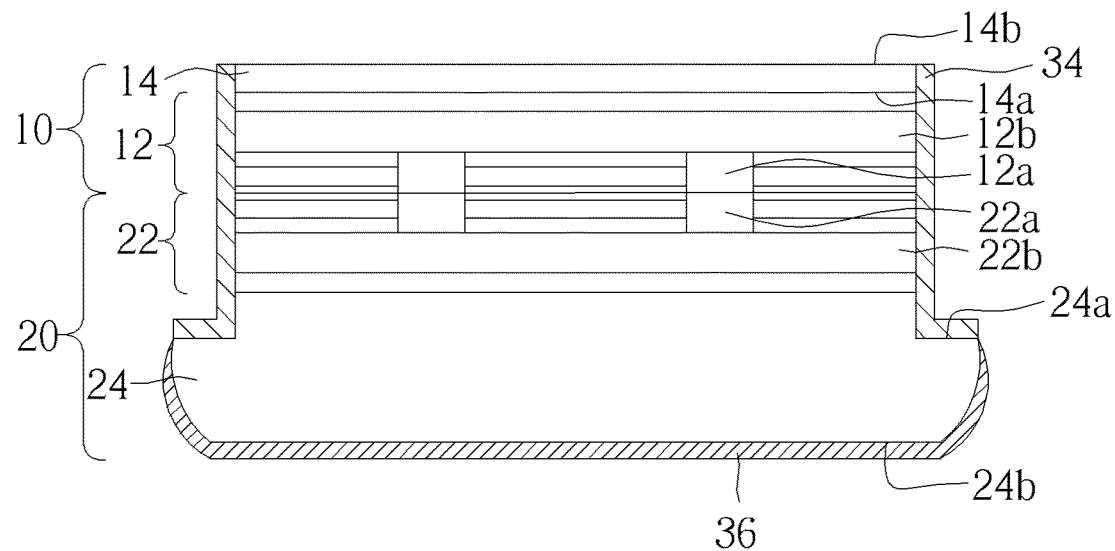

As shown in FIG. 6, the first wafer 10 and the second wafer 20 are flipped back. Subsequently, a second grind process 38 is performed to remove the silicon oxide layer 34 on the first back side 14b of the first silicon substrate 14 and to thin vertically the first back side 14b of the first silicon substrate 14. After the second grind process 38, the first silicon substrate 14 which remains preferably has a thickness about 15 μm.

Figure 7:
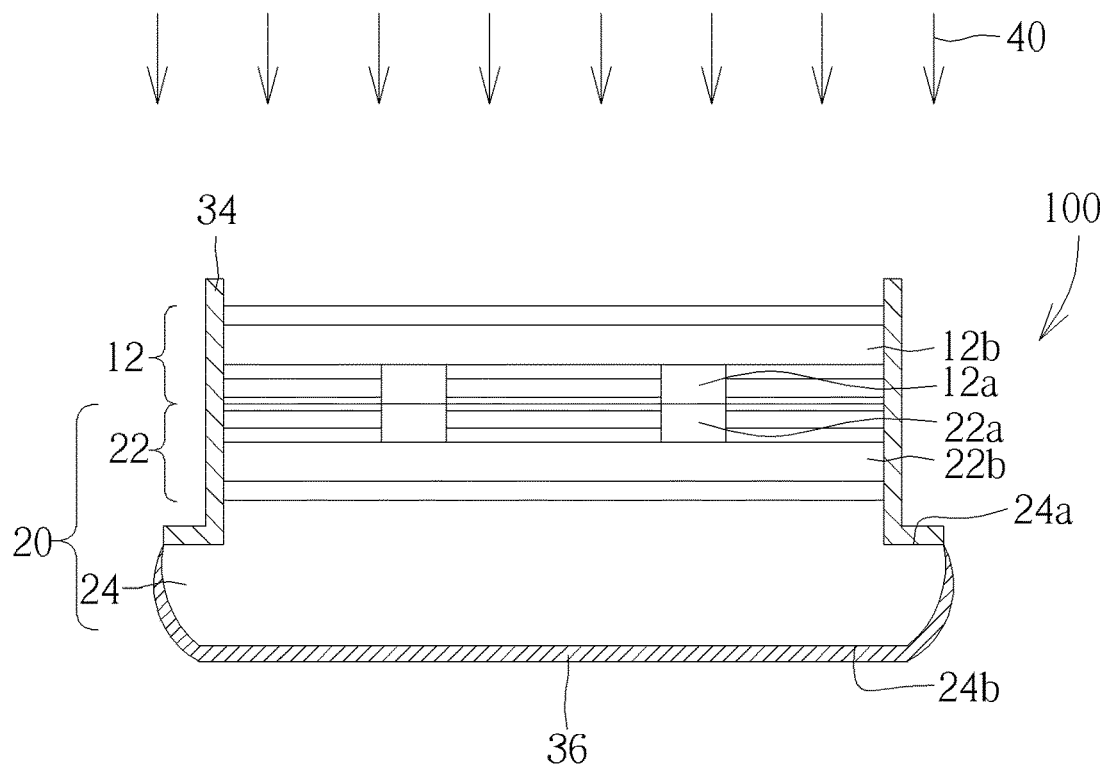

As shown in FIG. 7, a silicon remove process 40 is performed to remove only the first silicon substrate 14. In details, the silicon remove process 40 is performed by using tetramethylammonium hydroxide (TMAH) as an etchant to remove the first silicon substrate 14. Because the edge of the first device structure 12, the edge of the second device structure 22 are covered by the silicon oxide layer 34, and the second back side 24b and the sidewall of the second silicon substrate 24 are covered by the protective layer 36, only the first back side 14b of the first silicon substrate 14 is exposed in the TMAH. Therefore, only the first silicon substrate 14 is removed. Now, a method of forming a protective layer utilized in a silicon remove process of the present invention is completed, and a bonded wafer structure 100 is formed.

Figure 8:
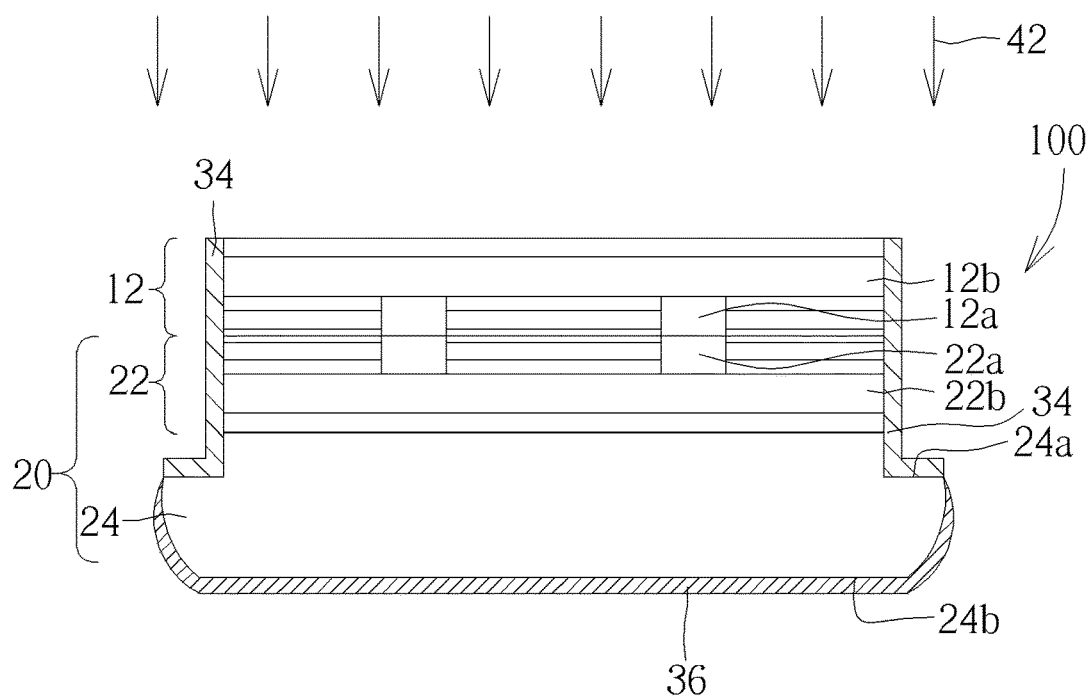
Figures 9, 10:
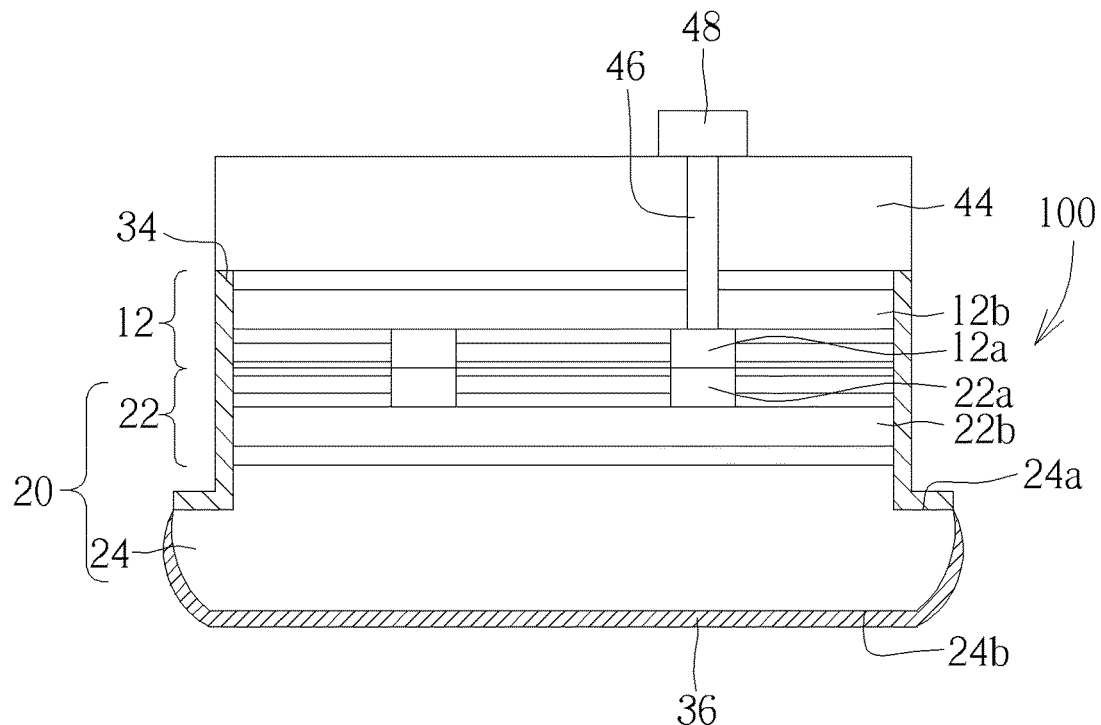

FIG. 8 to FIG. 9 depict a method of forming a deep via on a bonded wafer structure according to a preferred embodiment of the present invention, wherein elements which are substantially the same as those in FIG. 1 to FIG. 7 are denoted by the same reference numerals; an accompanying explanation is therefore omitted.

As show in FIG. 8, a planarization process such as a chemical mechanical planarization (CMP) process 42 is performed to remove the protruded silicon oxide layer 34 at the edge of the first device structure 12. After the CMP process 42, a second trim process (not shown) is performed optionally to remove the silicon oxide layer 34 on the edge of the first device structure 12 and on the edge of the second device structure 22 and to thin laterally the first device structure 12 and the second device structure 22. In this embodiment, the second trim process is omitted as an example.

As shown in FIG. 9, a dielectric layer 44 is formed to cover the first device structure 12. Later, a deep via 46 is formed to penetrate the dielectric layer 44 and to be disposed in the dielectric layer 12b of the first device structure 12. The deep via 46 contacts one of the interconnect 12a of the first device structure 12. Then, a conductive pad 48 is formed on a surface of the dielectric layer 44, and the conductive pad 48 contacts the deep via 46.

The step of forming the protective layer 36 can be formed at different stages, as long as the protective layer 36 is formed after the first trim process 32 and before the silicon remove process 40. In the embodiment illustrated above, the protective layer 36 is formed after forming the silicon oxide layer 34 and before the second grind process 38. As shown in FIG. 10, based on the different process designs, the protective layer 36 can be formed after the first trim process 32 and before forming the silicon oxide layer 34. On the other hand, the protective layer 36 can be formed after the second grind process 38 and before the silicon remove process 40.

Conventionally, the protective layer is formed on the second wafer at the stage of a shallow trench isolation process. After the protective layer is formed, the second wafer is absorbed on an e-chuck in front end of line (FEOL) semiconductor fabrication processes. However, because the protective layer is absorbed on the e-chuck, the surface of the protective layer is damaged. Later, after bonding the first wafer to the second wafer followed by using TMAH to etch the first silicon substrate, the TMAH may contact the second silicon substrate through the damaged regions of the protective layer. Then, the surface of the second silicon substrate is deteriorated.

The protective layer of the present invention is formed after bonding the first wafer to the second wafer. Therefore, the protective layer will not be damaged during the FEOL. In this way, the second silicon substrate can maintained its integrity.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a protective layer utilized in a silicon remove process, comprising:
   bonding a first wafer to a second wafer, wherein the first wafer comprises a first silicon substrate with a first device structure disposed thereon and the second wafer comprises a second silicon substrate with a second device structure disposed thereon;
   performing a first trim process to thin laterally an edge of the first wafer and an edge of the second device structure;
   after the first trim process, forming a silicon oxide layer covering the first wafer, a front side of the second silicon substrate and the edge of the second device structure;
   after the first trim process, forming a protective layer covering a back side of the second silicon substrate;
   after forming the silicon oxide layer, performing a second grind process to remove the silicon oxide layer on a back side of the first silicon substrate and to thin vertically the back side of the first silicon substrate; and
   after forming the protective layer, performing a silicon remove process to remove only the first silicon substrate.

2. The method of forming the protective layer utilized in the silicon remove process of claim 1, further comprising:
   before the first trim process, performing a first grind process to thin vertically a back side of the first silicon substrate.

3. The method of forming the protective layer utilized in the silicon remove process of claim 1, wherein the protective layer is formed after the first trim process and before forming the silicon oxide layer.

4. The method of forming the protective layer utilized in the silicon remove process of claim 1, wherein the protective layer is formed after forming the silicon oxide layer and before the second grind process.

5. The method of forming the protective layer utilized in the silicon remove process of claim 1, wherein the protective layer is formed after the second grind process and before the silicon remove process.

6. The method of forming the protective layer utilized in the silicon remove process of claim 1, wherein the protective layer comprises silicon oxide or silicon nitride.

7. The method of forming the protective layer utilized in the silicon remove process of claim 1, wherein when the protective layer is silicon oxide, a thickness of the protective layer is between 300 and 400 angstroms.

8. The method of forming the protective layer utilized in the silicon remove process of claim 1, wherein when the protective layer is silicon nitride, a thickness of the protective layer is between 400 and 700 angstroms.

9. The method of forming the protective layer utilized in the silicon remove process of claim 1, wherein the silicon remove process is performed by using tetramethylammonium hydroxide (TMAH) as an etchant to remove the first silicon substrate.

10. The method of forming the protective layer utilized in the silicon remove process of claim 1, further comprising:
    after the silicon remove process, forming a dielectric layer covering the first device structure;
    forming a deep via disposed in the dielectric layer; and
    forming a conductive pad on the dielectric layer, and the conductive pad contacting the deep via.

* * * * *